US009466696B2

(12) United States Patent
Mor et al.

(10) Patent No.: US 9,466,696 B2
(45) Date of Patent: Oct. 11, 2016

(54) FINFETS AND METHODS FOR FORMING THE SAME

(75) Inventors: Yi-Shien Mor, Hsin-Chu (TW); Hsiao-Chu Chen, Caotun Township (TW); Mu-Chi Chiang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/356,769

(22) Filed: Jan. 24, 2012

(65) Prior Publication Data

US 2013/0187206 A1    Jul. 25, 2013

(51) Int. Cl.
*H01L 29/78*    (2006.01)
*H01L 29/66*    (2006.01)

(52) U.S. Cl.
CPC ... *H01L 29/66628* (2013.01); *H01L 29/66545* (2013.01); *H01L 29/66795* (2013.01); *H01L 29/7851* (2013.01)

(58) Field of Classification Search
CPC ............... H01L 29/66628; H01L 29/66545; H01L 29/7851; H01L 29/66795
USPC ........................................ 257/347, 192, 288
See application file for complete search history.

(56) References Cited

U.S. PATENT DOCUMENTS

| | | | |
|---|---|---|---|
| 6,720,619 B1* | 4/2004 | Chen et al. | 257/347 |
| 6,936,516 B1 | 8/2005 | Goo et al. | |
| 7,172,943 B2 | 2/2007 | Yeo et al. | |
| 7,211,864 B2 | 5/2007 | Seliskar | |
| 7,544,994 B2 | 6/2009 | Schepis et al. | |
| 7,612,405 B2* | 11/2009 | Yu et al. | 257/328 |
| 7,622,773 B2 | 11/2009 | Irisawa et al. | |
| 7,651,893 B2* | 1/2010 | Chen et al. | 438/132 |
| 7,714,384 B2 | 5/2010 | Seliskar | |
| 7,728,324 B2 | 6/2010 | Tezuka et al. | |
| 7,812,370 B2 | 10/2010 | Bhuwalka et al. | |
| 7,863,674 B2* | 1/2011 | Yeo et al. | 257/329 |
| 7,879,675 B2 | 2/2011 | Radosavljevic et al. | |
| 7,915,112 B2 | 3/2011 | Xu et al. | |
| 7,972,914 B2 | 7/2011 | Kim et al. | |
| 8,053,299 B2 | 11/2011 | Xu | |
| 8,466,034 B2 | 6/2013 | Maszara et al. | |
| 8,466,511 B2* | 6/2013 | Oh et al. | 257/329 |
| RE44,431 E | 8/2013 | Pendse | |
| 8,735,232 B2* | 5/2014 | Baars et al. | 438/157 |
| 2002/0003256 A1 | 1/2002 | Maegawa | |
| 2002/0037619 A1 | 3/2002 | Sugihara et al. | |
| 2002/0072197 A1 | 6/2002 | Kang et al. | |

(Continued)

FOREIGN PATENT DOCUMENTS

CN      101677085      3/2010
KR      1020110098594  9/2011

*Primary Examiner* — Ermias Woldegeorgis
*Assistant Examiner* — Benjamin Tzu-Hung Liu
(74) *Attorney, Agent, or Firm* — Slater Matsil, LLP

(57) ABSTRACT

A device includes a semiconductor fin, a gate dielectric on sidewalls of the semiconductor fin, a gate electrode over the gate dielectric, and isolation regions. The isolation regions include a first portion on a side of the semiconductor fin, wherein the first portion is underlying and aligned to a portion of the gate electrode. The semiconductor fin is over a first top surface of the first portion of the isolation regions. The isolation regions further include second portions on opposite sides of the portion of the gate electrode. The second top surfaces of the second portions of the isolation regions are higher than the first top surface of the isolation regions.

19 Claims, 15 Drawing Sheets

(56) References Cited

U.S. PATENT DOCUMENTS

| | | |
|---|---|---|
| 2005/0056888 A1 | 3/2005 | Youn et al. |
| 2005/0145932 A1 | 7/2005 | Park et al. |
| 2005/0224800 A1 | 10/2005 | Lindert et al. |
| 2005/0263795 A1 | 12/2005 | Choi et al. |
| 2007/0020879 A1* | 1/2007 | Baek et al. .................. 438/424 |
| 2007/0045736 A1 | 3/2007 | Yagishita |
| 2007/0063263 A1 | 3/2007 | Oh et al. |
| 2007/0102763 A1 | 5/2007 | Yeo et al. |
| 2007/0134884 A1* | 6/2007 | Kim et al. .................. 438/424 |
| 2007/0210355 A1 | 9/2007 | Izumida |
| 2007/0235819 A1 | 10/2007 | Yagishita |
| 2008/0157172 A1 | 7/2008 | Lee |
| 2008/0299734 A1* | 12/2008 | Lee et al. ..................... 438/300 |
| 2009/0230483 A1 | 9/2009 | Mizumura et al. |
| 2009/0267155 A1 | 10/2009 | Izumida et al. |
| 2009/0315112 A1 | 12/2009 | Lee |
| 2010/0044784 A1 | 2/2010 | Oh et al. |
| 2010/0052059 A1 | 3/2010 | Lee |
| 2010/0133614 A1 | 6/2010 | Beyer et al. |
| 2010/0163970 A1 | 7/2010 | Rakshit et al. |
| 2010/0207208 A1 | 8/2010 | Bedell et al. |
| 2010/0301391 A1 | 12/2010 | Lochtefeld |
| 2011/0031552 A1 | 2/2011 | Iwamatsu et al. |
| 2011/0095378 A1 | 4/2011 | Lee et al. |
| 2011/0108930 A1 | 5/2011 | Cheng et al. |
| 2011/0147811 A1 | 6/2011 | Kavalieros et al. |
| 2011/0147828 A1 | 6/2011 | Murthy et al. |
| 2011/0147842 A1 | 6/2011 | Cappellani et al. |
| 2011/0171795 A1 | 7/2011 | Tsai et al. |
| 2011/0193178 A1 | 8/2011 | Chang et al. |
| 2011/0210404 A1 | 9/2011 | Su et al. |
| 2011/0215375 A1 | 9/2011 | Cook, Jr. |
| 2011/0223736 A1 | 9/2011 | Lin et al. |
| 2011/0291196 A1 | 12/2011 | Wei et al. |
| 2011/0316080 A1 | 12/2011 | Luo et al. |
| 2012/0001266 A1 | 1/2012 | Lim et al. |
| 2012/0074464 A1 | 3/2012 | Cea |
| 2012/0091528 A1 | 4/2012 | Chang et al. |
| 2012/0091538 A1 | 4/2012 | Lin et al. |
| 2012/0104472 A1 | 5/2012 | Xu et al. |
| 2012/0161238 A1 | 6/2012 | Scheiper et al. |
| 2012/0168817 A1 | 7/2012 | Abou-Khalil et al. |
| 2012/0211807 A1 | 8/2012 | Yu et al. |
| 2012/0261726 A1 | 10/2012 | Yang et al. |
| 2012/0299100 A1 | 11/2012 | Ota et al. |
| 2012/0319211 A1 | 12/2012 | van Dal et al. |
| 2013/0049140 A1 | 2/2013 | Asenov et al. |
| 2013/0099282 A1 | 4/2013 | Chen et al. |
| 2013/0134506 A1 | 5/2013 | Yagishita |
| 2013/0175584 A1 | 7/2013 | Ho et al. |
| 2013/0181264 A1* | 7/2013 | Liao et al. .................. 257/288 |
| 2013/0200455 A1 | 8/2013 | Lo et al. |
| 2013/0200459 A1 | 8/2013 | Adam et al. |
| 2013/0200468 A1 | 8/2013 | Cai et al. |
| 2013/0270628 A1 | 10/2013 | Huang et al. |
| 2013/0285141 A1 | 10/2013 | Kuo et al. |

\* cited by examiner

US 9,466,696 B2

FINFETS AND METHODS FOR FORMING THE SAME

BACKGROUND

With the increasing down-scaling of integrated circuits and increasingly demanding requirements to the speed of integrated circuits, transistors need to have higher drive currents with smaller dimensions. Fin Field-Effect Transistors (FinFETs) were thus developed. FinFETs have increased channel widths. The increase in the channel widths is achieved by forming channels that include portions on the sidewalls of semiconductor fins and portions on the top surfaces of the semiconductor fins. Since the drive currents of transistors are proportional to the channel widths, the drive currents of the FinFETs are increased.

In an existing FinFET formation process, Shallow Trench Isolation (STI) regions are first formed in a silicon substrate. The STI regions are then recessed to form silicon fins, which comprise portions of the silicon substrate that are over the recessed STI regions. Next, a gate dielectric, a gate electrode, and source and drain regions are formed to finish the formation of the FinFET. In the case there are electrical fuses to be formed on the same silicon substrate as the FinFET, the electrical fuses may also be formed simultaneously with the formation of the gate dielectric and the gate electrode.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A Fin Field-Effect Transistor (FinFET), an electrical fuse, and the methods of forming the same are provided in accordance with various embodiments. The intermediate stages of forming the FinFET and the electrical fuse are illustrated. The variations of the embodiments are discussed. Throughout the various views and illustrative embodiments, like reference numbers are used to designate like elements.

Figure 1:
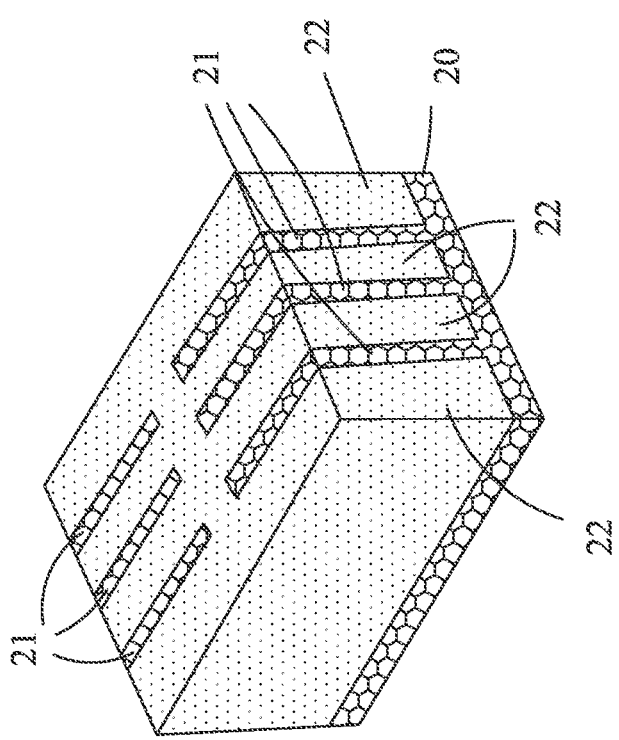
FIGS. 1 through 9B are perspective views and cross-sectional views of intermediate stages in the manufacturing of a FinFET in accordance with various exemplary embodiments.

FIGS. 1 through 9B are cross-sectional views and perspective views of intermediate stages in the manufacturing of a Fin Field-Effect Transistors (FinFET) in accordance with some exemplary embodiments. FIG. 1 illustrates a perspective view of an initial structure. The initial structure includes substrate 20. Substrate 20 may be semiconductor substrate, which may further be a silicon substrate, a germanium substrate, or a substrate formed of other semiconductor materials. Substrate 20 may be doped with a p-type or an n-type impurity. Isolation regions such as Shallow Trench Isolation (STI) regions 22 may be formed in substrate 20. The portions of substrate 20 between neighboring STI regions 22 form semiconductor strips 21. The top surfaces of semiconductor strips 21 and the top surfaces of STI regions 22 may be substantially level with each other. In some exemplary embodiments, the height different between the top surfaces of STI regions 22 and the top surfaces of semiconductor strips 21 is smaller than about 50 Å.

Figure 2:
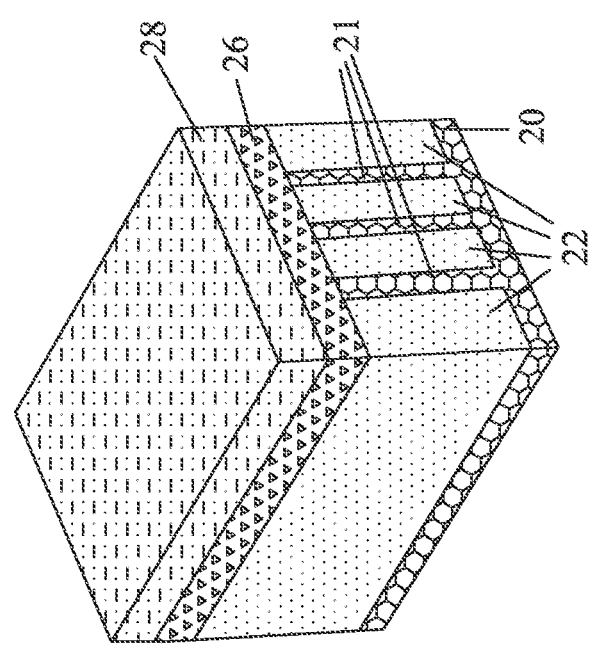

Referring to FIG. 2, polysilicon layer 26 is deposited. A Chemical Mechanical Polish (CMP) may then be performed to level the top surface of polysilicon layer 26. Hard mask layer 28 is then formed over polysilicon layer 26. Hard mask layer 28 may be formed of silicon nitride, for example, although other materials such as silicon oxide may also be used.

Figure 3:
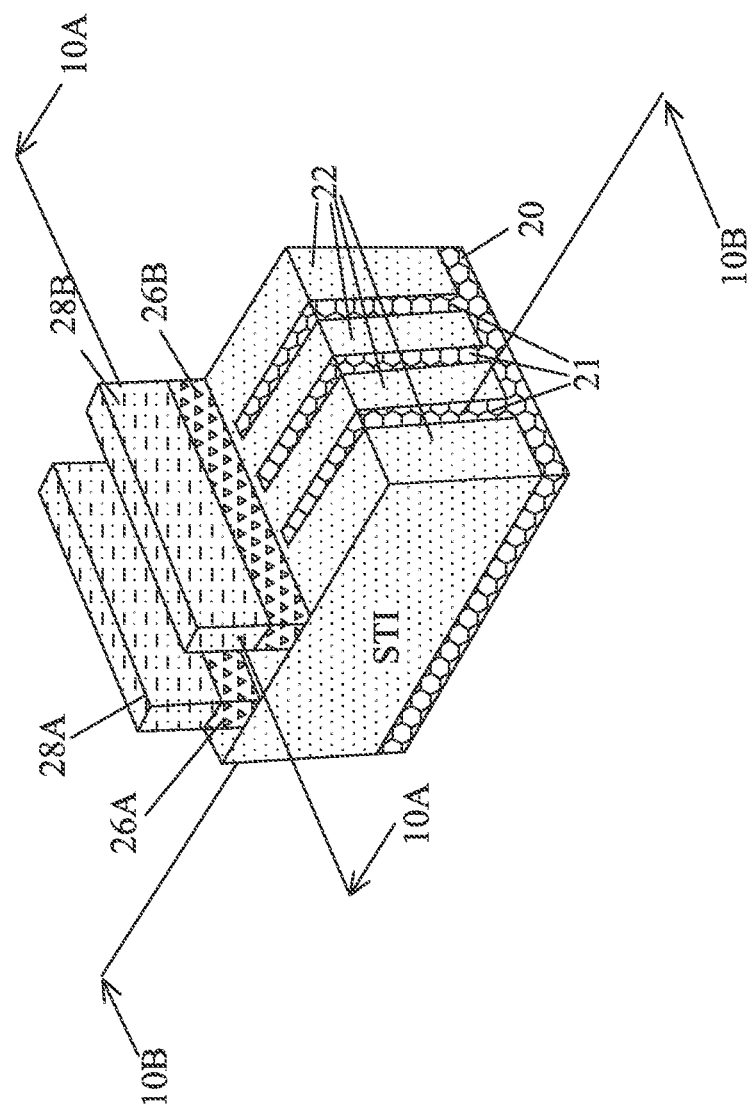

In FIG. 3, hard mask layer 28 is patterned, and the remaining portions of hard mask layer 28 comprise hard mask patterns 28A and 28B. To pattern hard mask layer 28, a photo resist (not shown) may be formed and patterned first, and the patterned photo resist is used as an etching mask to pattern hard mask layer 28. The patterned photo resist is then removed.

Next, as also shown in FIG. 3, hard mask patterns 28A and 28B are used as etching masks to etch the underlying polysilicon layer 26. The resulting remaining portions of polysilicon layer 26 may include polysilicon strips 26A and 26B. Polysilicon strip 26A is over portions of semiconductor strips 21, and may cross-over one or a plurality of semiconductor strips 21. Polysilicon strip 26A may also have a lengthwise direction substantially perpendicular to the lengthwise direction of semiconductor strips 21. Polysilicon strip 26B is over a portion of STI region 22, and may not be over and aligned to any of semiconductor strips 21. Since the top surfaces of semiconductor strips 21 and the top surfaces of STI regions 22 may be substantially level with each other, the bottom surfaces of polysilicon strips 26A and 26B may also be substantially level with each other. In addition, the bottom surface of polysilicon strip 26B is substantially planar.

Figure 4:
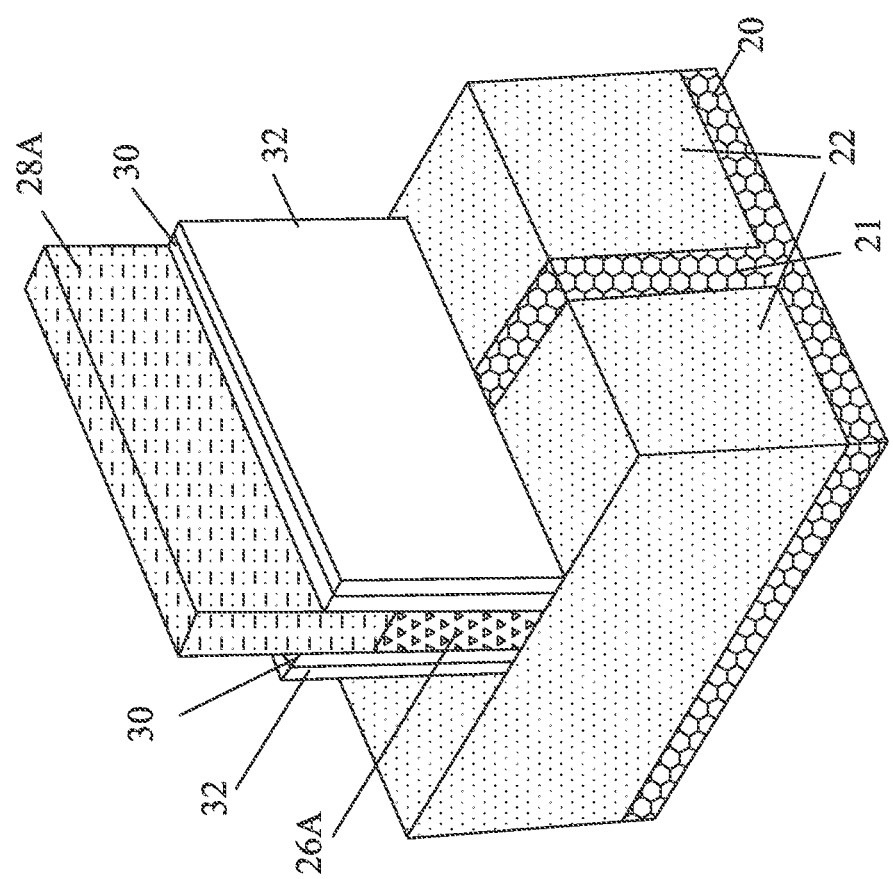
Figure 5:
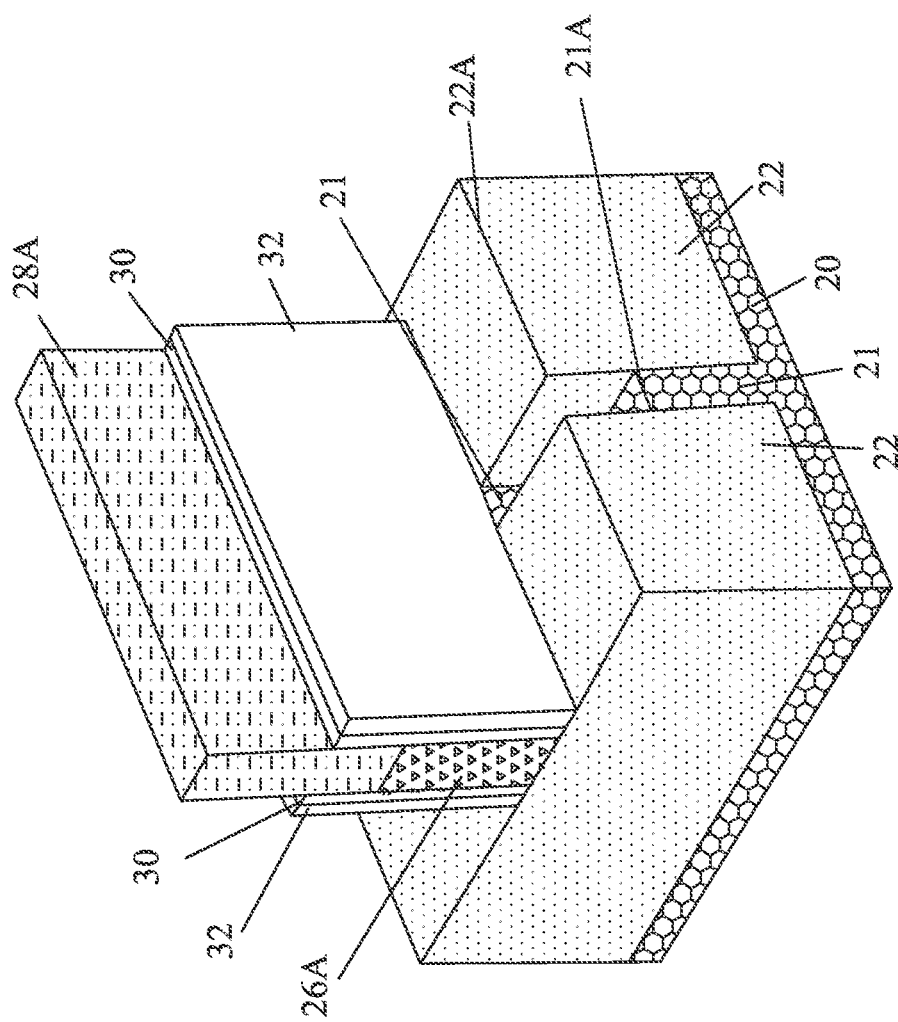

Next, as shown in FIG. 4, seal layer 30 and gate spacers 32 are formed on the sidewalls of polysilicon strips 26A. In the meantime, seal layer 30 and gate spacers 32 will also be formed on the sidewalls of polysilicon strips 26B as shown in FIG. 3, although FIG. 4 does not show polysilicon strip 26B. It is noted that FIGS. 4 through 6 illustrate a portion of the structure shown in FIG. 3, wherein a single silicon strip 21 is illustrated. In some embodiments, seal layer 30 is formed of a dielectric material such as silicon nitride, although other dielectric materials such as silicon oxide, silicon oxynitride, silicon carbide, combinations thereof, and multi-layers thereof, may be used. Gate spacers 32 may comprise silicon oxide, silicon nitride, and the like, and may have a multi-layer structure.

Figure 6A:
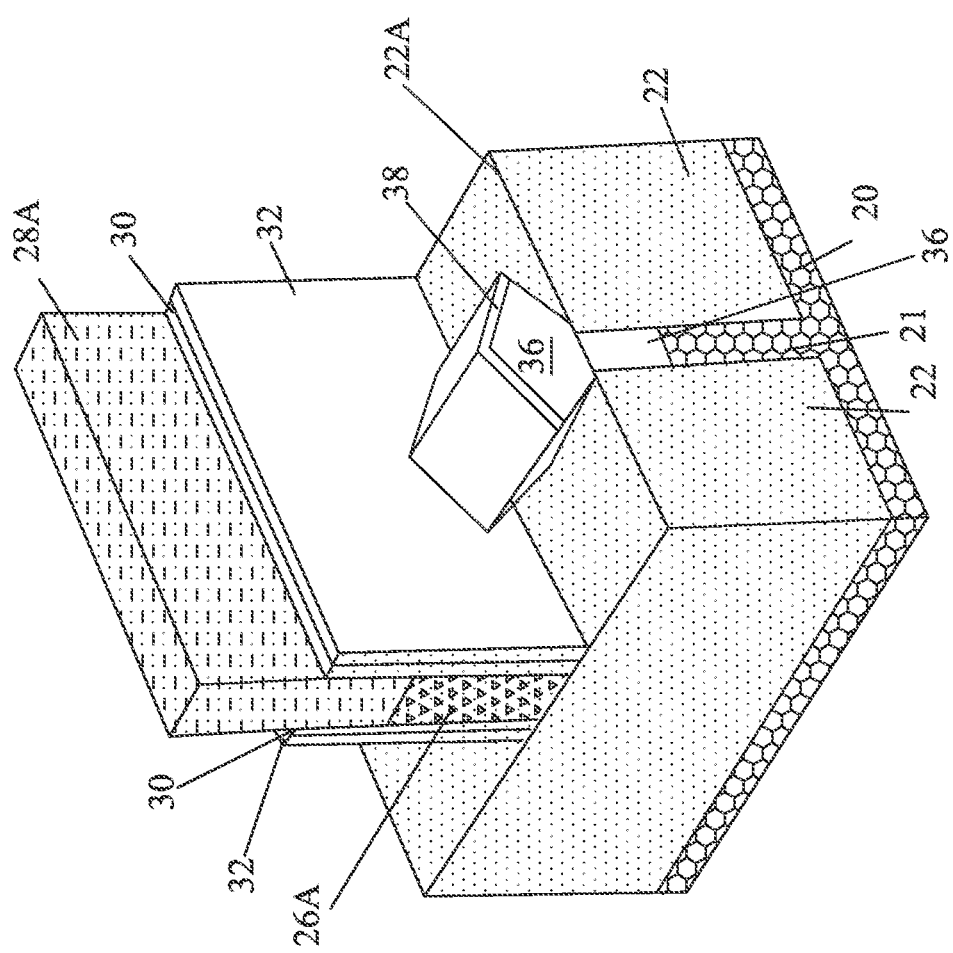

Referring to FIG. 5, an etching step is performed to etch portions of semiconductor strip 21 that are not covered by hard mask patterns 28A and 28B, seal layers 30, and gate spacers 32. The resulting top surface 21A of the recessed semiconductor strip 21 is thus lower than the top surfaces 22A of STI regions 22. Recesses are accordingly formed between STI regions 22. The recesses include portions that on opposite sides of polysilicon strip 26A. Next, as shown in FIG. 6A, epitaxy regions 36 are formed by selectively growing a semiconductor material in the recesses. In some exemplary embodiments, epitaxy regions 36 comprise silicon germanium or silicon carbon. Alternatively, epitaxy regions 36 are formed of silicon. After the recesses are filled with epitaxy regions 36, the further epitaxial growth of epitaxy regions 36 causes epitaxy regions 36 to expand horizontally, and facets start to form. Furthermore, some of top surfaces 22A of STI regions 22 are underlying and over portions of epitaxy regions 36 due to the horizontal growth of epitaxy regions 36. After the epitaxy step, epitaxy regions 36 may be implanted to form source and drain regions, which are also denoted using reference numeral 36. Source and drain regions 36 are on opposite sides of polysilicon strip 26A, and may be overlying and overlapping portions of surfaces 22A of STI regions 22. Following the formation of source and drain regions 36, source and drain silicide regions 38 may be formed by siliciding the top portions of epitaxy regions 36.

Figure 6B:
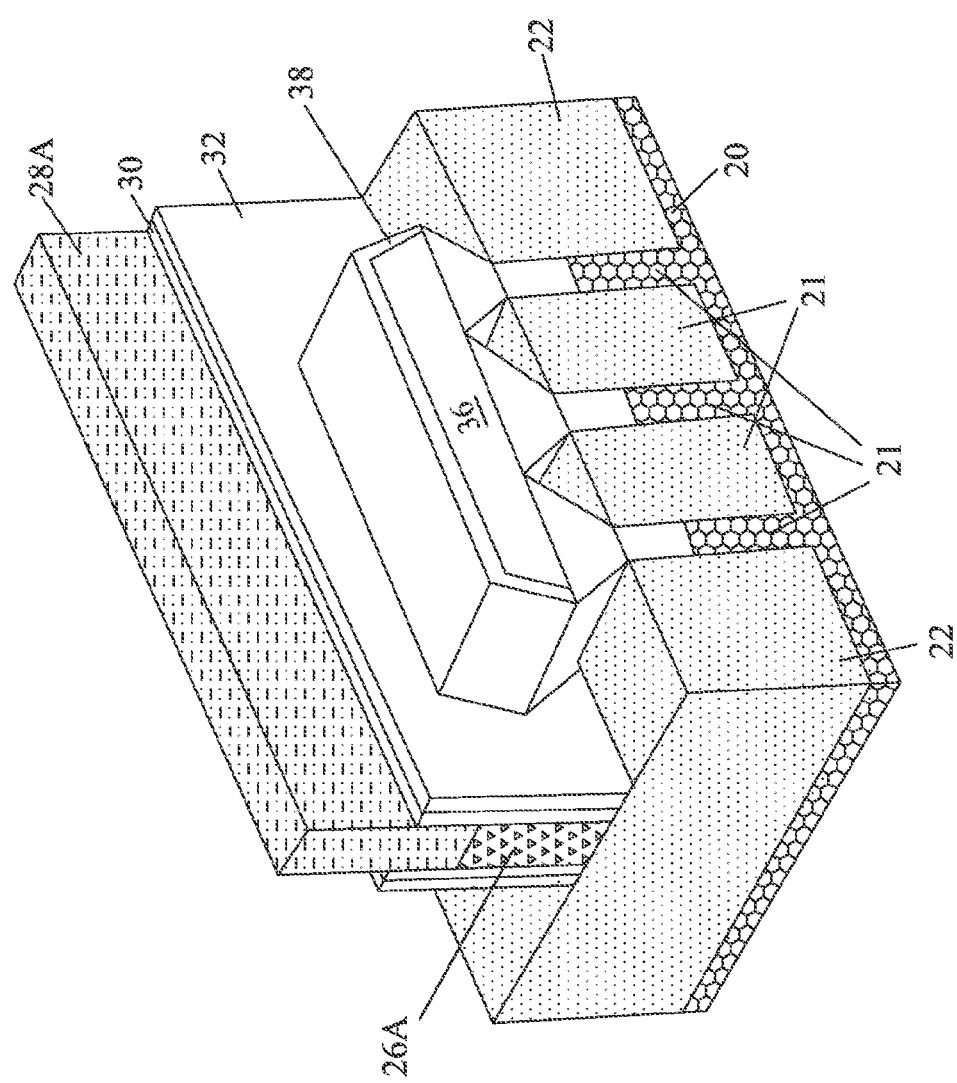

FIG. 6B illustrates essentially the same step as shown in FIG. 6A, except that a plurality of epitaxy regions 36 may be grown from a plurality of recesses between STI regions 22. Epitaxy regions 36 comprise portions that are above the top surfaces of STI regions 22, which portions grow horizontally. The laterally expanded portions may merge with each other to form a large epitaxy region, which may be implanted to form a large source and drain region 36. Silicide regions 38 may then be formed.

Figure 7:
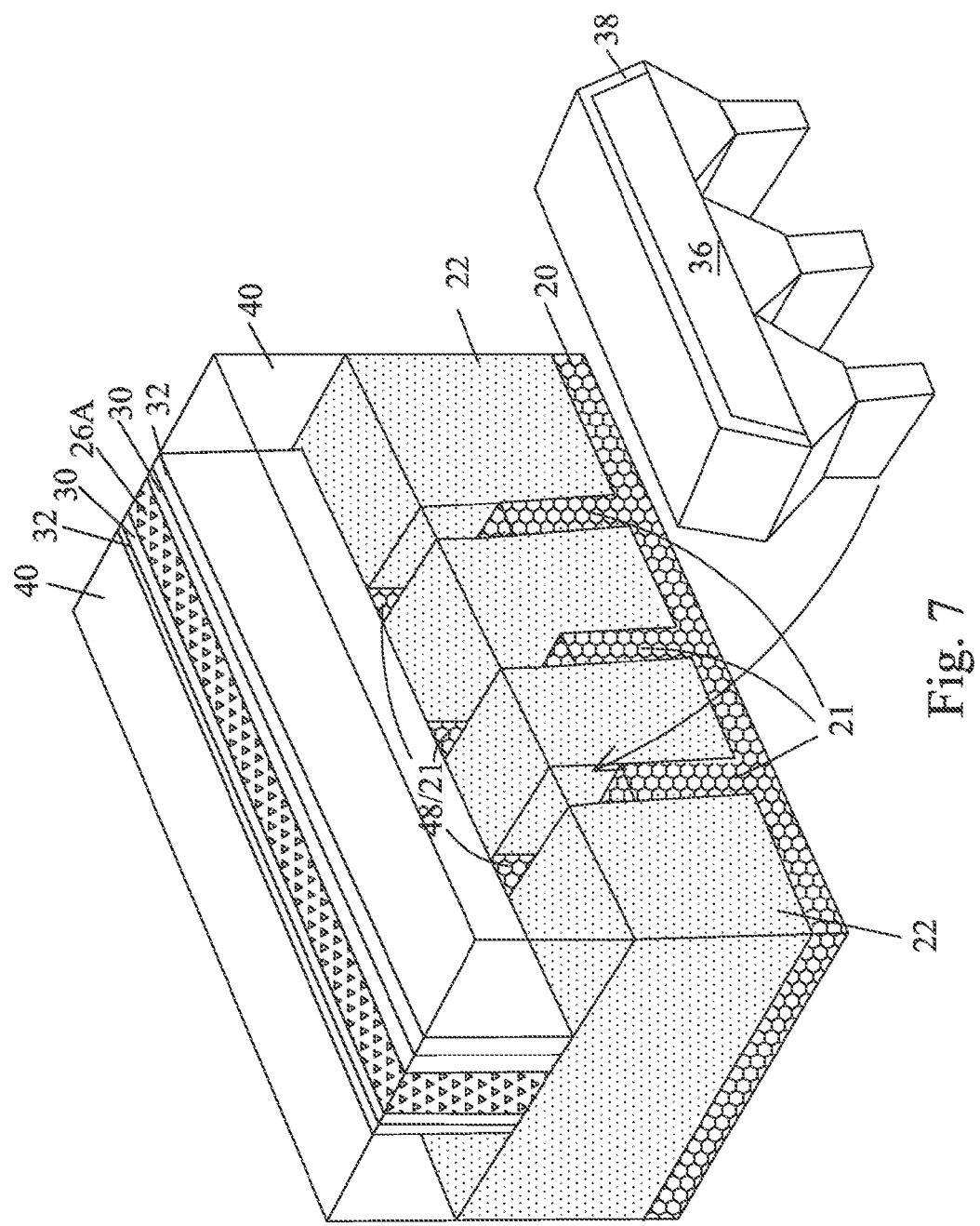

FIG. 7 illustrates the formation of Inter-Layer Dielectric (ILD) 40. In some embodiments, ILD 40 may include carbon-containing oxides or other dielectric materials. ILD may be filled until its top surface is higher than the top surface of polysilicon strip 26A, or higher than hard mask patterns 28A and 28B (note shown in FIG. 7, please refer to FIGS. 3 and 4). A CMP is then performed to remove excess ILD 40. In some embodiments, polysilicon strips 26A and 26B (not shown in FIG. 7, please refer to FIG. 3) are used as a CMP stop layer, so that the top surfaces of ILD 40 is level with the top surfaces of polysilicon strips 26. In alternative embodiments, hard mask patterns 28A and 28B (not shown in FIG. 7, please refer to FIG. 3) may also be used as a CMP stop layer. In the embodiments wherein hard mask patterns 28A and 28B are used as the CMP stop layer, after the CMP, an etching step may be performed to remove hard mask pattern 28A. For a clear view of what is behind ILD 40, in FIGS. 7 and 8A, the ILD 40, seal layer 30, and spacer 32 in front of the polysilicon strip 26A are drawn as transparent. Furthermore, epitaxy regions 36 and silicide regions 38 are drawn aside of ILD 40, although epitaxy regions 36 and silicide regions 38 are actually underlying ILD 40.

Figure 8A:
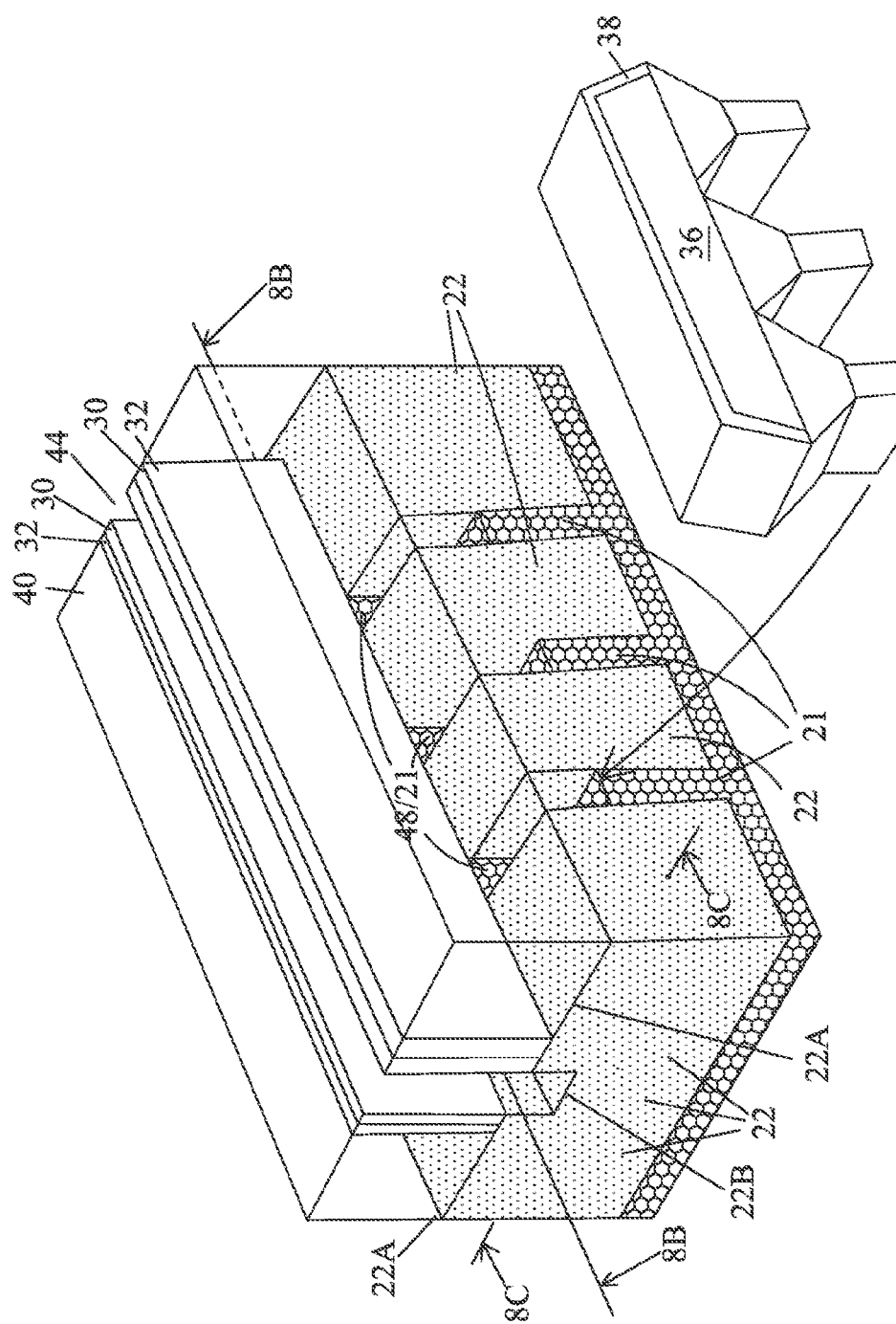

Next, referring to FIG. 8A, polysilicon strip 26A is removed in an etching step, so that recess 44 is formed between opposite seal layers 30, gate spacers 32, and ILD regions 40. Accordingly, polysilicon strip 26A is also referred to as a dummy polysilicon strip throughout the description. After the removal of dummy polysilicon strip 26A, the etching is continued to further etch the portions of STI regions 22 underlying the removed dummy polysilicon strip 26A, so that recess 44 extends down into STI regions 22. The step of recessing may comprise an anisotropic etching, so that the sidewalls of recess 44 are substantially straight and vertical, and are aligned to the respective sidewalls of seal layers 30 (please refer to FIG. 8C). As a result, STI regions 22 have top surfaces 22B generated by the etching step. Top surfaces 22B are lower than top surfaces 22A of STI regions 22. During the removal of polysilicon strip 26A and the etching-down of STI regions 22, portions of semiconductor strips 21 are exposed in recess 44. The exposed portions of semiconductor strips 21 are not etched.

Figure 8B:
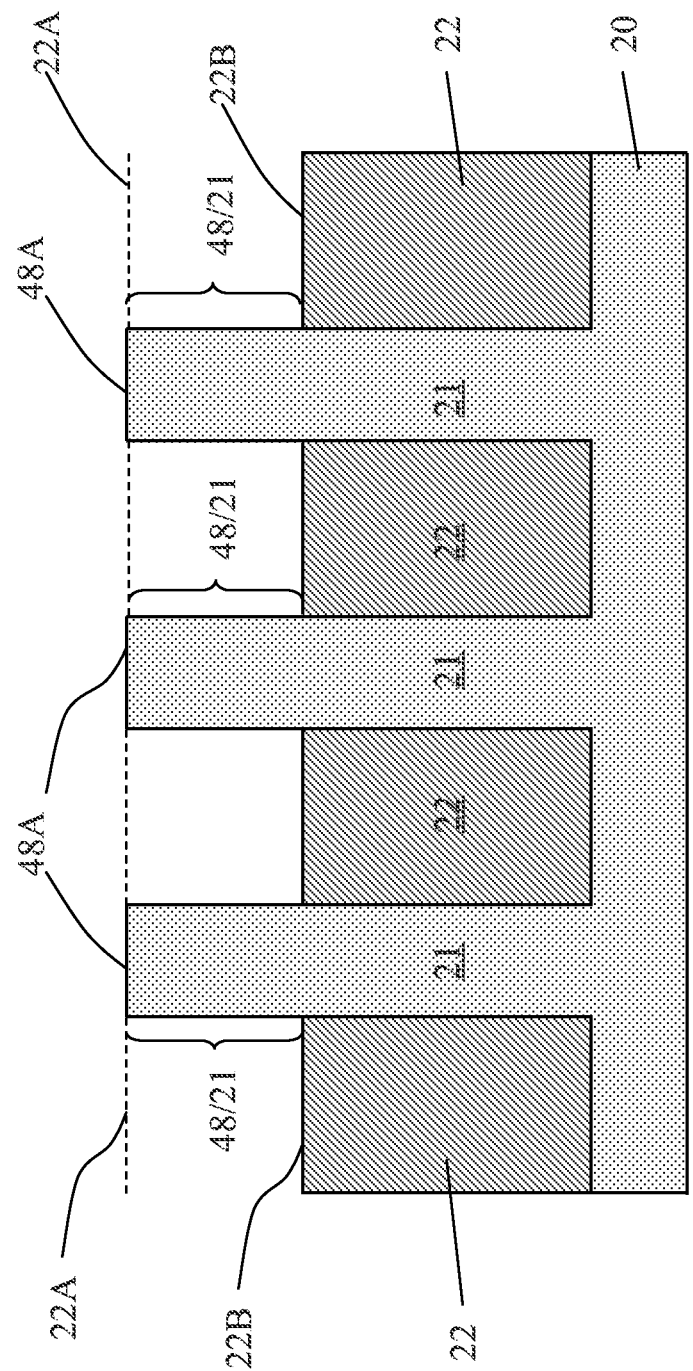
Figure 8C:
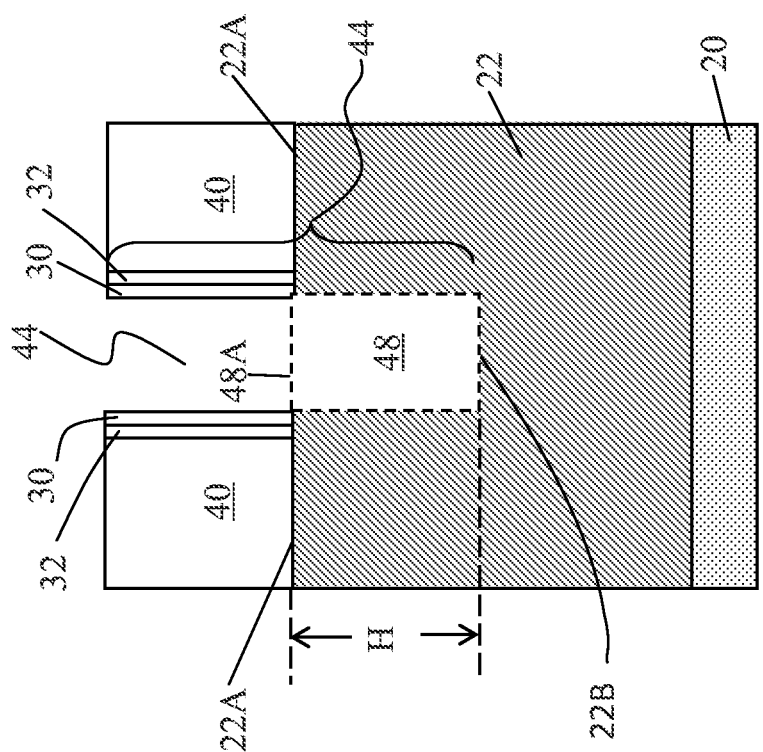

FIGS. 8B and 8C illustrate the cross-sectional views of the structure shown in FIG. 8A, wherein the cross-sectional views are obtained from the planes crossing lines 8B-8B and 8C-8C, respectively, in FIG. 8A. Referring to FIG. 8B, portions of semiconductor strips 21 are over top surfaces 22B of STI regions 22, which portions of semiconductor strips 21 are referred to as semiconductor fins 48 hereinafter. Top surfaces 48A of semiconductor fins 48 may be substantially level with, although they may be slightly higher than or lower than, top surfaces 22A of STI regions 22. Since top surfaces 22A are not in the plane shown in FIG. 8B, top surfaces 22A are illustrated using dashed lines.

FIG. 8C also illustrates the top surfaces 22A and 22B of STI regions 22. In some embodiments, height difference H (which is also close to the fin heights of fins 48) between top surfaces 22A and 22B may be between about 0.15 μm and about 0.4 μm in some exemplary embodiments. It is realized, however, that the dimensions recited throughout the description are examples, and may be changed to different values. Top surface 48A of semiconductor fin 48 is illustrated using a dashed line in FIG. 8C since semiconductor fin 48 is not in the plane shown in FIG. 8C.

Figure 9A:
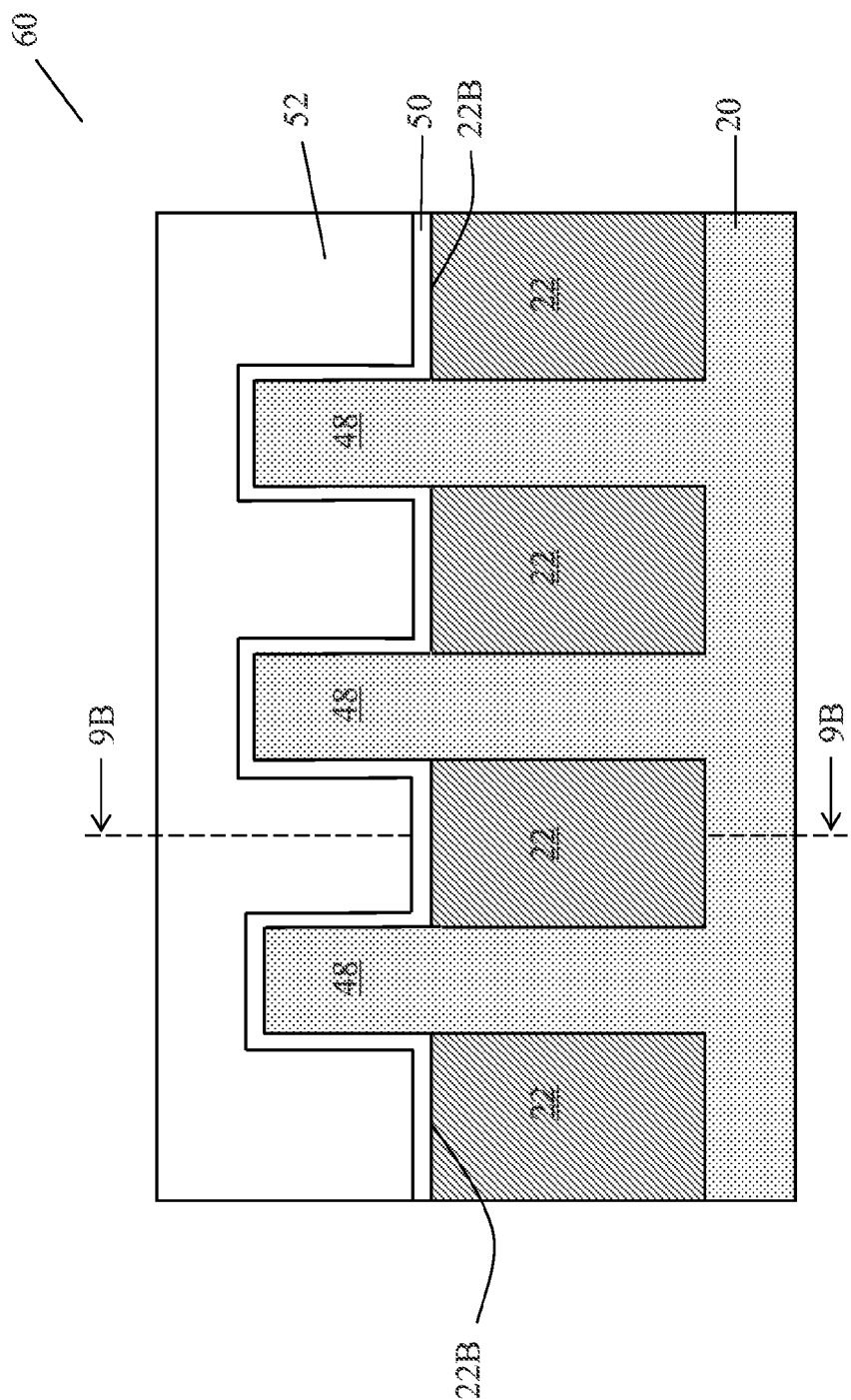
Figure 9B:
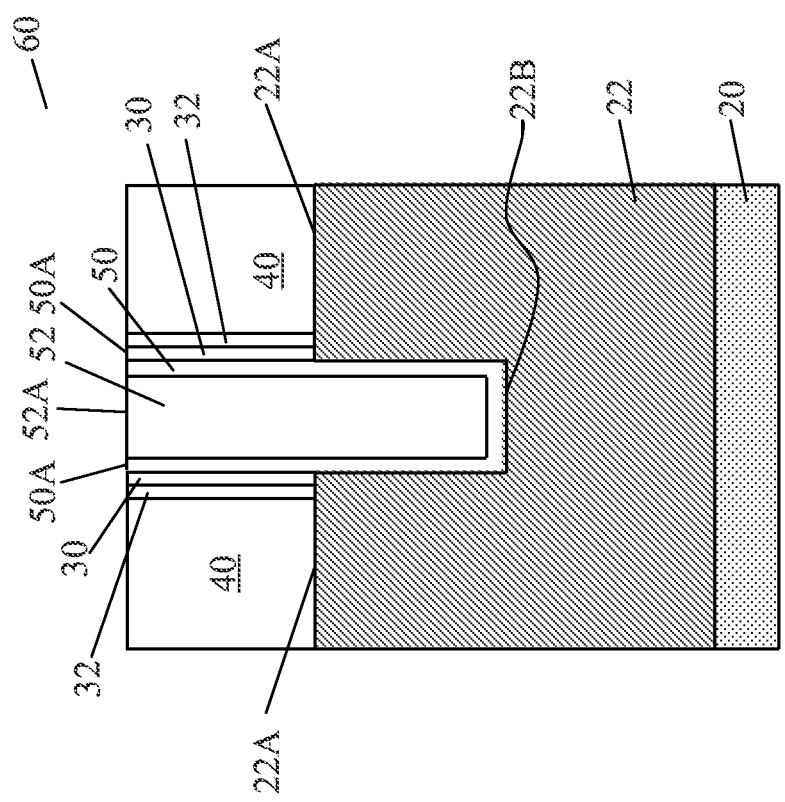

FIGS. 9A and 9B illustrate the formation of gate dielectric layer 50 and electrode 52. The cross-sectional views are obtained from the same planes that cross lines 8B-8B and 8C-8C, respectively, in FIG. 8A. First, gate dielectric layer 50 is formed in recess 44 (FIG. 8A) and on the top surfaces and the sidewalls of semiconductor fins 48. In accordance with some embodiments, gate dielectric layer 50 comprises silicon oxide, silicon nitride, or multilayers thereof. In alternative embodiments, gate dielectric layer 50 comprises a high-k dielectric material, and hence is alternatively referred to as high-k gate dielectric layer 50 throughout the description. High-k gate dielectric layer 50 may have a k value greater than about 7.0, and may include a metal oxide or a silicate of Hf, Al, Zr, La, Mg, Ba, Ti, Pb, and combinations thereof. The formation methods of gate dielectric layer 50 may include Molecular-Beam Deposition (MBD), Atomic Layer Deposition (ALD), Physical Vapor Deposition (PVD), and the like.

Next, conductive material 52 is formed over gate dielectric layer 50, and fills the remaining recess 44 (FIG. 8A). Conductive material 52 may comprise a metal-containing material such as TiN, TaN, TaC, Co, Ru, Al, combinations thereof, and multi-layers thereof. The work function of conductive material 52 may be, or may not be, a band-edge work function, depending on whether the respective FinFET is a p-type FinFET or an n-type FinFET. After the filling of conductive material 52, a CMP may be performed to remove the excess portions of gate dielectric layer 50 and conductive material 52 over the top surface of ILD 40. The resulting remaining portions of the conductive material and gate dielectric layer 50 thus form the replacement gate, which includes gate electrode 52 and gate dielectric 50, respectively, of the resulting FinFET 60.

Referring to FIG. 9B, due to the replacement-gate formation process, top edge 50A of gate dielectric 50 is level with top edge 52A of gate electrode 52. In subsequent process steps, an additional ILD (not shown) may be formed over ILD 40, and contact plugs (not shown) may be formed to penetrate through the additional ILD and ILD 40 to electrically couple to gate electrode 52 and silicide regions 38 (FIGS. 6A and 6B). The formation of FinFET 60 is thus finished.

It is observed that in the resulting FinFET 60, the STI regions 22 that are on opposite sides of a same gate electrode 52 (FIG. 9B) have top surfaces 22A that are higher than top surface 22B that are underlying (and aligned to) gate electrode 52. This is different from the conventional FinFETs. In the conventional FinFETs, the STI regions 22 that are on the opposite sides of a gate electrode have top surfaces that are level with the top surface of the portion of the STI region that is underlying (and aligned to), the gate electrode. In addition, top surfaces 22A of STI regions 22 that are on the opposite sides of a same epitaxy source/drain region 36 (FIG. 8A) are substantially level with the top surfaces of semiconductor fins 48, as shown in FIG. 8B. This is also different from the existing FinFETs, in which the top surfaces of the STI regions that are on the opposite sides of a same epitaxy source/drain region are lower than the respective semiconductor fin of the respective FinFET.

Figure 10A:
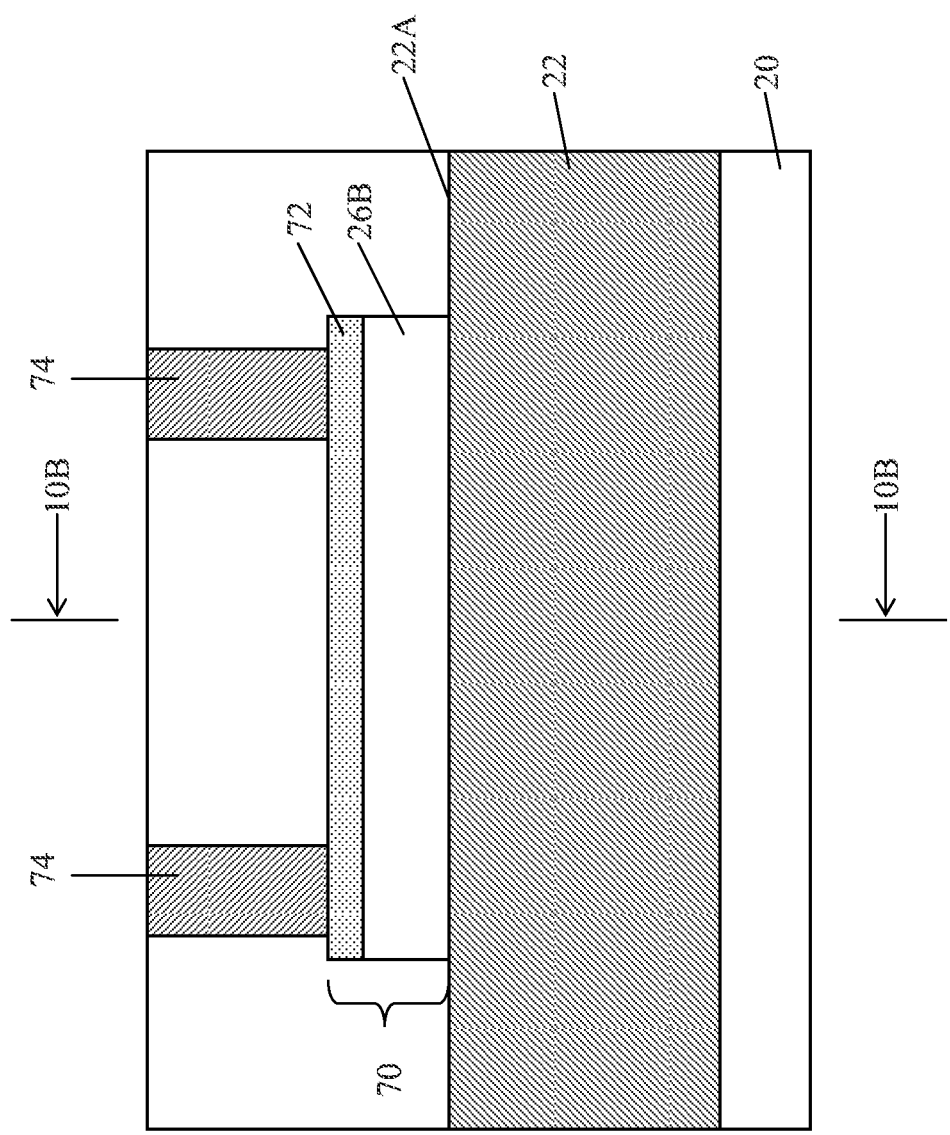
FIGS. 10A and 10B illustrate an electrical fuse in accordance with exemplary embodiments.
Figure 10B:
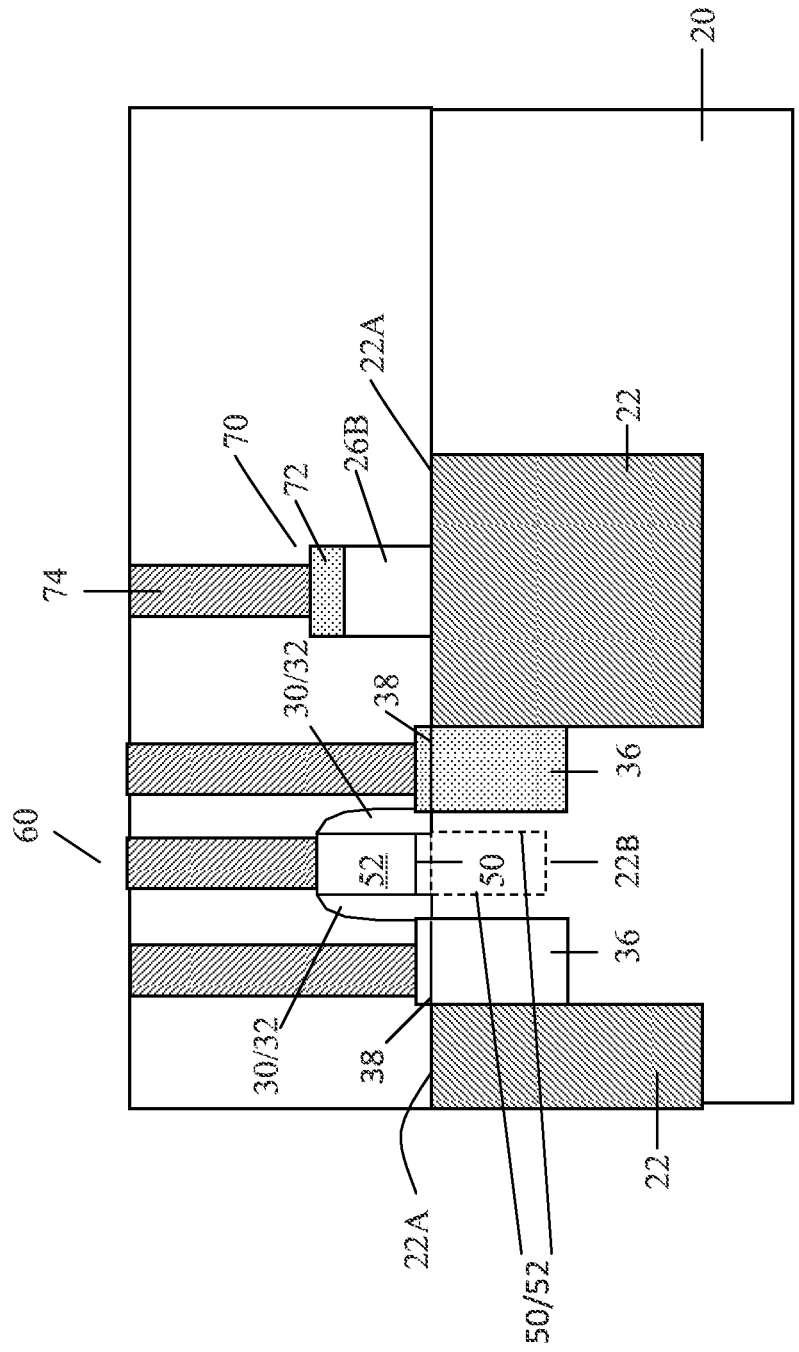

FIGS. 10A and 10B illustrate electrical fuse 70 formed using the process steps shown in FIGS. 1 through 9B. The cross-sectional view in FIG. 10A is obtained from the same plane that crosses line 10A-10A in FIG. 3, except that the cross-sectional view in FIG. 10A is retrieved at a time after the formation of FinFET 60 (FIGS. 9A and 9B). Electrical fuse 70 may include polysilicon strip 26B, which may be formed in the same step shown in FIG. 3. In the subsequent steps, hard mask pattern 28B is removed. Silicide region 72 may be formed on polysilicon strip 26B, for example, in the same step that silicide region 38 in FIG. 6A is formed. Contact plugs 74 are formed over, and electrically coupled to, the opposite ends of silicide region 72. Electrical fuse 70 may be programmed by applying a current and/or a voltage between contact plugs 74 to burn a middle portion of silicide region 72, so that the resistance measured from contact plugs 74 increases from a low resistance to a high resistance. The low resistance and the high resistance represent the "0" and "1" states of electrical fuse 70.

FIG. 10B illustrates a cross-sectional view of the structure shown in FIG. 10A. Also, the cross-sectional view is obtained from the same plane that crosses line 10B-10B in FIG. 3, except the cross-sectional view is retrieved after FinFET 60 and electrical fuse 70 are formed. The positions of surfaces 22A and 22B are schematically illustrated. From FIGS. 10A and 10B, it is observed that fuse 70 is formed on top surface 22A of STI region 22. This is made possible due to the fact that polysilicon strip 26B is formed (as shown in FIG. 3) before the recessing of STI regions 22 (shown in FIG. 8A). As a comparison, in the conventional electrical fuse formation process that is integrated with the formation of FinFETs, the electrical fuses were formed on the recessed STI region. As a result, the height of the electrical fuse is reduced in the embodiments compared to the conventional fuse formation processes. The resistance of the electrical fuse in accordance with embodiments is thus increased due to the reduced fuse height.

In accordance with embodiments, a device includes a semiconductor fin, a gate dielectric on sidewalls of the semiconductor fin, a gate electrode over the gate dielectric, and isolation regions. The isolation regions include a first portion on a side of the semiconductor fin, wherein the first portion is underlying and aligned to a portion of the gate electrode. The semiconductor fin is over a first top surface of the first portion of the isolation regions. The isolation regions further include second portions on opposite sides of the portion of the gate electrode. The second top surfaces of the second portions of the isolation regions are higher than the first top surface of the isolation regions.

In accordance with other embodiments, a device includes a semiconductor substrate, and STI regions extending into the semiconductor substrate. The STI regions include a first portion having a first top surface, and a second portion having a second top surface. The first top surface is lower than the second top surface. A semiconductor fin has a bottom surface lower than the second top surface of the STI regions, and a top surface that is not substantially higher than the second top surface of the STI regions. A FinFET includes a gate electrode, which comprises a portion lower than the second top surface of the STI regions.

In accordance with yet other embodiments, a method includes forming isolation regions extending from a top surface of a semiconductor substrate into the semiconductor substrate, wherein the isolation regions have a first top surface, and wherein a portion of the semiconductor substrate between two neighboring ones of the isolation regions forms a semiconductor strip. A dummy gate strip is formed over the semiconductor strip, wherein a lengthwise direction of the dummy gate strip is perpendicular to a lengthwise direction of the semiconductor strip. A portion of the dummy gate strip is aligned to a portion of the semiconductor strip. The dummy gate strip is then removed. After the step of removing the dummy gate strip, a portion of the isolation regions that is under the dummy gate strip is recessed to form a recess. A recessed portion of the isolation regions has a second top surface lower than the first top surface. A portion of the semiconductor strip exposed through the recess forms a semiconductor fin that is over the second top surface of the isolation regions.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
a first semiconductor fin and a second semiconductor fin parallel to each other;
a gate dielectric on sidewalls of the first semiconductor fin and the second semiconductor fin;
a gate electrode over the gate dielectric, with the gate dielectric and the gate electrode comprised in a Fin Field-Effect Transistor (FinFET); and
isolation regions comprising:
a first portion between the first and the second semiconductor fins, wherein the first portion is overlapped by the gate electrode, with the first portion having a first top surface extending from the first semiconductor fin to the second semiconductor fin, and wherein the semiconductor fin is above the first top surface of the first portion of the isolation regions; and
second portions on opposite sides of the gate electrode, wherein second top surfaces of the second portions of the isolation regions are higher than an entirety of the first top surface of the isolation regions and level with a top surface of the first semiconductor fin, wherein the first portion and the second portions are formed of a same dielectric material, and wherein the first top surface is connected to the second top surfaces through substantially straight vertical sidewalls of the isolation regions; and a source/drain region comprising a lower portion lower than the second top surfaces, wherein the first semiconductor fin has a first width, and the lower portion of the source/drain region has a second width equal to the first width, with both the first width and the second width measured at a same level as the second top surfaces, and wherein both the first width and the second width are measured in a same direction perpendicular to a source-to-drain direction of the FinFET.

2. The device of claim 1, wherein the first and the second portions of the isolation regions form a continuous isolation region.

3. The device of claim 1 further comprising a source/drain region connected to an end of the first semiconductor fin, wherein the isolation regions comprise third portions on opposite sides of the source/drain region, and wherein the third portions of the isolation regions comprise top surfaces level with the second top surfaces of the isolation regions.

4. The device of claim 1 further comprising:
a semiconductor strip overlapped by the first semiconductor fin, wherein a first edge of the semiconductor strip is in contact with a second edge of the first portion of the isolation regions, and wherein the first edge is continuously connected to a third edge of the first semiconductor fin.

5. The device of claim 1 further comprising a gate spacer on a sidewall of the gate electrode, wherein the gate spacer comprises a bottom surface in contact with a top surface of the first semiconductor fin and the second top surfaces of the isolation regions.

6. The device of claim 1, wherein the gate dielectric and the gate electrode form a replacement gate stack, with a top edge of the gate dielectric level with a top edge of the gate electrode.

7. The device of claim 1, wherein the substantially straight vertical sidewalls extend in a direction parallel to a lengthwise direction of the gate electrode.

8. The device of claim 7, wherein the gate dielectric comprises a vertical portion, and wherein an edge of the vertical portion is over, and is aligned to, one of the substantially straight vertical sidewalls.

9. The device of claim 1, wherein the gate dielectric comprises:
a first portion overlapped by the gate electrode, with a top surface of the first portion contacting a bottom surface of the gate electrode; and
a second portion and a third portion over the first portion, wherein the second portion and the third portion contact opposite sidewalls of the gate electrode, and wherein the second portion and the third portion are connected to opposite ends of the first portion.

10. The device of claim 9, wherein the second portion and the third portion of the gate dielectric are below the second top surfaces of the second portions of the isolation regions.

11. The device of claim 1, wherein the second top surfaces are higher than an entirety of the first top surface, and the entirety of the first top surface is substantially planar.

12. A device comprising:
a semiconductor substrate;
a first and a second semiconductor fin parallel to each other; and
a Fin Field-Effect Transistor (FinFET) comprising:
a gate electrode, wherein the gate electrode comprises:
a first portion and a second portion overlapping the first and the second semiconductor fins, respectively; and
a third portion connecting the first portion to the second portion; and
a gate dielectric comprising:
a first portion overlapped by the gate electrode, with a top surface of the first portion contacting a bottom surface of the gate electrode;
a second portion and a third portion over the first portion, wherein the second portion and the third portion contact opposite sidewalls of the gate electrode, and wherein the second portion and the third portion are connected to opposite ends of the first portion;
source and drain regions on opposite sides of the gate electrode; and
a Shallow Trench Isolation (STI) region between the first and the second semiconductor fins, wherein the STI region comprises:
a first top surface overlapped by the third portion of the gate electrode, wherein the first top surface extends all the way from the first semiconductor fin to the second semiconductor fin; and
second top surfaces overlapped by the source and drain regions, wherein the second top surfaces are higher than an entirety of the first top surface and level with a top surface of the first semiconductor fin, wherein one of the source and drain regions comprises a lower portion lower than the second top surfaces, wherein the first semiconductor fin has a first width, and the lower portion of the one of the source and drain regions has a second width equal to the first width, and wherein both the first width and the second width are measured at a same level as the second top surfaces, and with both the first width and the second width measured in a same direction perpendicular to a source-to-drain direction of the FinFET.

13. The device of claim 12, wherein a first portion of the STI region comprising the first top surface and second portions of the STI region comprising the second top surfaces are continuously connected.

14. The device of claim 12 further comprising a gate spacer on a sidewall of the gate electrode, wherein the gate spacer comprises a bottom surface in contact with a top surface of the first semiconductor fin and the second top surfaces of the STI region.

15. The device of claim 12, wherein the STI region comprises a first edge aligned to a second edge of the first semiconductor fin, with the first edge and the second edge substantially in a same vertical plane.

16. The device of claim 15 further comprising:
a semiconductor strip overlapped by the first semiconductor fin, wherein the semiconductor strip comprises a third edge continuously connected to the second edge, and wherein the third edge is in the same vertical plane.

17. The device of claim 15, wherein the gate dielectric comprises a vertical portion, wherein an edge of the vertical portion is over, and is aligned to, a substantially straight vertical sidewall of the STI region, wherein the substantially straight vertical sidewall connects the first top surface to one of the second top surfaces.

18. The device of claim 12, wherein the STI region further comprises:
a first portion overlapped by the third portion of the gate electrode, with the first top surface being a top surface of the first portion; and
second portions overlapped by the source and drain regions, with the second top surfaces being top surfaces of the second portions, wherein the first portion and the second portions are formed of a same dielectric material.

19. The device of claim 12, wherein the second portion and the third portion of the gate dielectric are below the second top surfaces of the STI region.

\* \* \* \* \*